United States Patent

Chen et al.

Patent Number: 5,518,131
Date of Patent: May 21, 1996

[54] ETCHING MOLYDBENUM WITH FERRIC SULFATE AND FERRIC AMMONIUM SULFATE

[75] Inventors: Hsing H. Chen, Dutchess County, N.Y.; Lawrence D. David, Chittenden County, Vt.; Derek B. Harris, Tompkins County, N.Y.

[73] Assignee: International Business Machines Corporation, Armonk, N.Y.

[21] Appl. No.: 250,896

[22] Filed: Jul. 7, 1994

[51] Int. Cl.$^6$ ............................................. C01G 39/00
[52] U.S. Cl. ........................ 216/100; 216/93; 252/79.2
[58] Field of Search .................... 252/79.1, 79.2; 216/90, 92, 100, 93

[56] References Cited

U.S. PATENT DOCUMENTS

| | | | |
|---|---|---|---|
| 3,808,071 | 4/1974 | Lerner | 156/16 |
| 3,962,005 | 6/1976 | Lerner | 156/16 |
| 4,747,907 | 5/1988 | Acocella et al. | 156/642 |
| 4,995,942 | 2/1991 | David | 156/642 |

FOREIGN PATENT DOCUMENTS

| | | |
|---|---|---|
| 268333 | 7/1990 | Czechoslovakia . |
| 2229256 | 12/1973 | Germany . |
| 34711 | 4/1985 | Hungary . |
| 1325098 | 7/1987 | U.S.S.R. . |
| 955000 | 4/1964 | United Kingdom . |

OTHER PUBLICATIONS

A. F. Bogenschütz, W. Braun and J. L. Jostan, Metalloberfläche, 29(9), 451–455 (1975) (Discussed on p. 1 of the Specification).

M. Beyer, A. F. Bogenschütz, and J. L. Jostan, Metalloberfläche, 29(10), 506–511 (1975) (Discussed on p. 1 of the Specification).

J. D. David and M. T. Kurdziel, Metal Finiahing, 86(5) 47–49 (1988) (Discussed on p. 1 of the Specification).

F. A. Cotton and G. Wilkinson, Advanced Inorganic Chemistry, 5th Ed., p. 717. Wiley–Interscience (1988) (Discussed on p. 5 of the Specification).

M. J. Grieco and D. L. Klein, Etching of Molybdenum Thin Films, IBM Technical Disclosure Bulletin, vol. 11, No. 10, Mar. 1969, p. 1246.

*Primary Examiner*—R. Bruce Breneman
*Assistant Examiner*—George Goudreau
*Attorney, Agent, or Firm*—Whitham, Curtis, Whitham, & McGinn; Steven Soucar

[57] ABSTRACT

A molybdenum etching process which reduces hazardous treatment waste is disclosed. Etchants which can be used are ferric sulfate and ferric ammonium sulfate. Waste products resulting from this etch are $Fe(OH)_3$ and $CaSO_4$.

9 Claims, 1 Drawing Sheet

ETCHING MOLYBDENUM WITH FERRIC SULFATE AND FERRIC AMMONIUM SULFATE

BACKGROUND OF THE INVENTION

1. Field of the Invention

The present invention generally relates to methods for etching of molybdenum for fabricating a metal mask to be used in electronic packaging and semiconductor fabrication processes and, more particularly, to a method of etching molybdenum with an etchant which contains no cyanide and which does not emit noxious fumes when heated.

2. Description of the Prior Art

Current practice in molybdenum etching is to use ferricyanide. See, for example, A. F. Bogenschfitz, W. Braun, and J. L. Jostan, *Metalloberfläiche*, 29(9), 451–455 (1975), M. Beyer, A. F. Bogenschiitz, and J. L. Jostan, *Metalloberfläche*, 29(10), 506–511 (1975), and J. D. David and M. T. Kurdziel, *Metal Finishing*, 86(5) 47–49 (1988). The ferricyanide mask etching operations for molybdenum is performed at pH≈13:

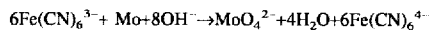

Ferrocyanide is then recycled with ozone:

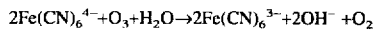

Little etch waste results, but considerable quantities of rinse waste result, however, which are difficult to deal with because of the cyanide content of the iron complexes.

In addition, the etchant pH must be maintained around 13 to avoid polymerizing molybdate to molybdenum oxide and polymolybdate gels. This high pH, however, often results in resist delamination and resist stripping from the molybdenum. This limits the choice of photoresists to those that are not resistant to bases.

An etchant containing ferricyanide has been devised at neutral pH (~4) for molybdenum and tungsten etching is described in U.S. Pat. No. 4,995,942, but the cyanide bearing waste is still a disposal problem. Ferricyanide produces chemical wastes which are difficult and expensive to dispose because it contains cyano complexes.

Ferric nitrate is an alternative etchant which has been documented as an effective molybdenum etch. See D. M. Allen, The Principles and Practice of Photochemical Machining and Photoetching, 81, Adam Hilger, Boston (1986). Ferric nitrate etches anisotropically with respect to grain boundaries of the crystal structure of the molybdenum material. The molybdenum that meets the thickness uniformity and flatness criteria necessary for metal evaporation and screening masks has a high degree of orientation in its grain structure. This results in diamond shaped holes, as shown in FIG. 1, when the molybdenum is etched with ferric nitrate, regardless of the shape of the artwork. This is unacceptable for molybdenum masks. In addition, during the etch process ferric nitrate produces nitric acid, which has a boiling point of 83° C., making it very volatile in the processing environment.

The need thus exists for a molybdenum etchant, which contains no cyanide, even complexed cyanide, which yields good etch rates, etch profiles, and etch quality. The etchant and its waste must be easily treatable by conventional neutralization methods to yield nonhazardous effluent and sludge cheaply. The etchant also must not attack conventional polyphenolic photoresists.

SUMMARY OF THE INVENTION

It is therefore an object of the present invention to provide a molybdenum etchant which reduces intensive hazardous treatment waste yet is capable of satisfying mask fabrication requirements.

It is another object of this invention to provide an etchant for molybdenum which is less volatile, provides a safer environment for operators, and is noncorrosive to stainless steel.

It is a further object of this invention to provide flexibility in selecting photoresists which can be subjected to etching operations on molybdenum.

It is yet another object of this invention to provide isotropic etching of molybdenum.

It is still another object of this invention to provide faster etch rates on molybdenum than can be accomplished using ferricyanide.

According to the invention, ferric sulfate $Fe_2(SO_4)_3 \cdot nH_2O$ and ferric ammonium sulfate $NH_4Fe(SO_4)_2$ are used as etchants for molybdenum. Ferric sulfate and ferric ammonium sulfate produce wastes which can be readily treated using simple and inexpensive neutralization methods. Ferrous ions can be oxidized to ferric ions and then precipitated out as ferric hydroxide by raising the pH. Sulfate ion can be precipitated as calcium sulfate with lime. Both precipitates are neither toxic nor corrosive. During the etching process, ferric nitrate produces nitric acid while ferric sulfate produces sulfuric acid. Nitric acid with a boiling point of 83° C. is much more volatile than sulfuric acid, which has a boiling point of 330° C. Consequently, ferric sulfate provides a much safer environment for the operators. Ferric sulfate does not corrode 316 stainless steel, which is commonly used in manufacturing tools. Ferric sulfate and ferric ammonium sulfate give isotropic etching, producing hole shapes dependent on the shape of the artwork. Ferric sulfate also uses acid resistant photoresists, thereby providing flexibility for selecting different photoresists.

The substitution of both ferric sulfate and ferric ammonium sulfate for ferricyanide yields comparable or superior etch rates, and no resist attack. Wastes can be easily treated using simple neutralization methods. The etchant is recyclable by reoxidyzing with oxygen or ozone. Round shaped holes in molybdenum can be obtained regardless of the crystal structure/grain boundaries of the metal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Ferric sulfate, $Fe_2(SO_4)_3 \cdot nH_2O$, and ferric ammonium sulfate, $NH_4Fe(SO_4)_2$, have been found to efficiently etch molybdenum metal. Ferric sulfate, in concentration ranging from 20 to 40 weight percent, and pH in the range +0.50 to −0.50, will etch 1–3 mils/hour of molybdenum at temperatures up to 60° C. Higher temperatures are feasible, but not necessary. The etch rate can be speeded up by doing the process in a spray etches from two sides. Masks patterned with resist have exhibited etch rates in 30% $Fe_2(SO_4)_3$ at 50° C. comparable to ferrous cyanide.

It is necessary to maintain the low pH of the etchant for two reasons. First, the ferric ions must be prevented from gelling due to the formation of hydroxo- and oxo- bridged species:

$$Fe(H_2O)_6^{3+} \rightleftharpoons Fe(OH)(H_2O)_5^{2+} + H^+$$

$$2[Fe(OH)(H_2O)_5]^{2+} \rightleftharpoons [(H_2O)_5FeOFe(H_2O)_5]^{++++} + H_2O$$

See F. A. Cotton and G. Wilkinson, *Advanced Inorganic Chemistry*, 5th Ed., p. 717, Wiley-Interscience (1988).

The other reason is that during the spraying, the etchant picks up oxygen from the air and recycles the $Fe^{2+}$ product of etching back to $Fe^{3+}$. In this process acid is consumed:

$$2Fe^{2+} + 1/2O_2 + 2H^+ \rightarrow 2Fe^{3+} + H_2O$$

The pH is thus maintained throughout by metering in 50–100% $H_2SO_4$.

The etching reaction consumes six moles of ferric ion per mole of molybdenum etched as is seen from the following equation:

$$6Fe^{3+} + Mo + 6MoO_4^{2-} \rightarrow Mo_7O_{24}^{6-} + 6Fe^{2+}$$

Although $MoO_4^{2-}$ does not exist at pH<11, the formation of polymolybdates, such as $Mo_7O_{24}^{6-}$ and other higher soluble polyions, is certain because no insoluble molybdenum bearing precipitates form during the etching, and the polymolybdates are the only soluble Mo(VI) species at these pH values.

Ferric sulfate waste is easily treated. Merely raising the pH to greater than 2 precipitates iron as hydrogel oxide:

$$Fe^{3+} + 3OH^- \rightarrow Fe(OH)_3\downarrow$$

and sulfate is precipitated by a lime bed:

$$Ca^{2+} + SO_4^{2-} \rightarrow CaSO_4\downarrow$$

No poisonous or corrosive residues can thus pass an ordinary waste treatment facility. This offers economically superior handling ease over any cyano complex based etchant.

Figure 1:
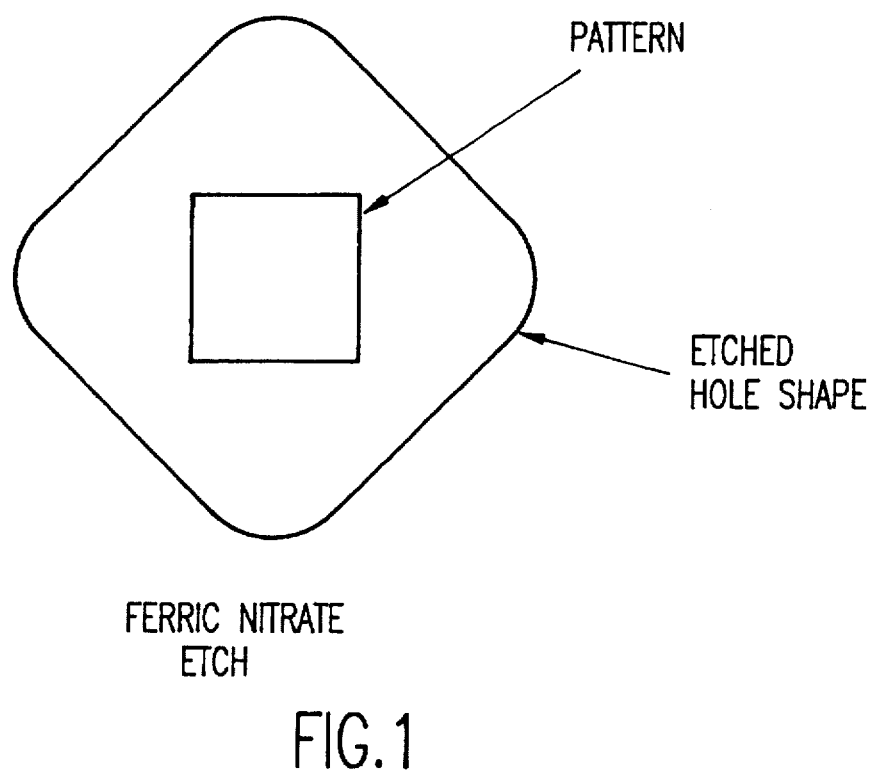
FIG. 1 shows a plan view of a pattern and a resultant etched hole in molybdenum using a ferric nitrate etch.
Figure 2:
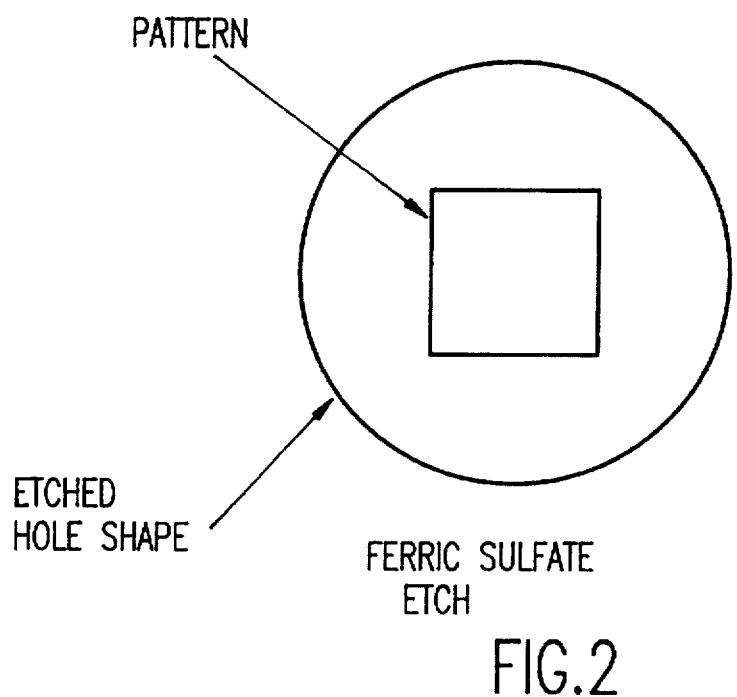
FIG. 2 shows a plan view of a pattern and a resultant etched hole in molybdenum using a ferric sulfate etch.

The choice of ferric sulfate based etchants is not obvious. Not only is etch rate important, but also the quality of the etch profiles, particularly of hole walls through a mask. The holes should be uniform in shape. In contrast to the diamond-shaped holes shown in FIG. 1 obtained using ferric nitrate etch, ferric sulfate etch, yields round holes, as is shown in FIG. 2. Thus, ferric salts will etch molybdenum in different ways, depending on the identity of the counterion and the crystal structure/grain boundaries of the metal. Round holes, however, are required for the molybdenum masks.

Another advantage of ferric sulfate is that unlike ferric nitrate and ferric chloride, this etchant can be heated to 9° C. without any outgassing. Ferric nitrate emits acrid fumes of nitric acid even at 50° C., and ferric chloride outgasses HCl above 60° C. This feature facilitates the constructions of ventilation for etching stations which can use ferric sulfate.

The low pH of ferric sulfate does not cause any observed resist degradation or delamination in the conditions evaluated. Thus, by changing over the etchant from ferricyanide to ferric sulfate the resist delamination problems in molybdenum mask etching are solved.

As mentioned before, the etch is recycled with adventitious atmospheric oxygen. Ozone can also be used if the need arises to recycle etchant more quickly due to heavier throughput.

The oxidation/reduction potential (ORP) is thus controlled with ozone or oxygen throughput to maintain this at a constant level, thus ensuring constant $[Fe^{3+}]/[Fe^{2+}]$ ratio, and thus uniform etching. pH is monitored and leveled simultaneously, with $H_2SO_4$ additions. The etchant thus does not become depleted and is immortal.

EXAMPLES

EXAMPLE 1

A ferric sulfate solution was made by dissolving 1,486 g $Fe_2(SO_4)_3 \cdot nH_2O$ in 1,620 ml $H_2O$. The solution was ≈36 weight percent $Fe_2(SO_4)_3$, corrected for the waters of hydration. A molybdenum foil weighing 18.8 g with a surface area of 233 cm² was immersed in a beaker of the solution while it was maintained between 63° C. and 69° C. After 45 minutes, the foil weighed 16.6 grams. Thus, an etch rate of 3.4 mils/hour, or 1.7 mils/hour/side was achieved.

EXAMPLE 2

A 5.1 mil thick molybdenum foil with photoresist covering all but a repeating pattern of approximately 2 mil square openings was suspended in the ferric sulfate solution. The solution temperature was held between 57° and 63° C. After two hours in the solution the molybdenum foil was etched through with two repeating patterns of round holes. There was no evidence of preferential etching with respect to crystal or grain orientation, as evidenced by the uniform roundness of the holes.

EXAMPLE 3

A 5.1 mil thick molybdenum foil with the same pattern as in Example 2 was placed in a rotary spray etcher. A ferric sulfate solution, of ≈25 weight percent maintained at 50° C., was sprayed from the rotating manifold onto the stationary foil. After 45 minutes, a pattern had been etched through the molybdenum foil corresponding to the photoresist pattern. Thus, as expected, spray etching accelerated the etch rate about three times compared to beaker etch (at a higher temperature or 57°–63° C.).

EXAMPLE 4

A 2.1 mil thick molybdenum foil was placed in the spray etcher with the 25 weight percent $Fe_2(SO_4)_3$ solution. The foil was patterned with 2.4 mil diameter vias and 1.6 mil lines. After 15 minutes of spraying at 50° C., the pattern defined by the photoresist was etched through the foil. This demonstrated the etch feasibility of a foil ≈40% as thick as one in Example 3.

In alternative embodiments, molybdenum articles including molybdenum masks, molybdenum thin films, molybdenum coatings on substrates, and the like may be substituted for the molybdenum foil of the examples. In additional, alternative embodiments, resistive coatings which are resistant to the etching solution of the invention, including refractory or unreactive metal coatings, polymer coatings, glass coatings, silicon oxide coatings, silicon nitride coatings, and the like, may be substituted for the photoresist of the examples.

While the invention has been described in terms of a preferred embodiment and illustrated by several specific examples, those skilled in the art will recognize that the invention can be practiced with modification within the spirit and scope of the appended claims.

Having thus described our invention, what we claim as new and desire to secure by Letters Patent is as follows:

1. A method of etching molybdenum comprising the steps of:

providing a molybdenum article to be etched with a resistive coating covering all but desired feature areas, which feature areas do not have a resistive coating and are exposed for etching;

etching said feature areas of the molybdenum article with an etchant selected from the group consisting of ferric sulfate and ferric ammonium sulfate, said etching being performed at ambient pressure; and rinsing the molybdenum article with water after etching.

2. The method recited in claim 1 wherein said step of etching is performed by spraying said etchant on said feature areas.

3. The method recited in claim 1 wherein said step of etching is performed by immersing said molybdenum article in said etchant.

4. A method of etching molybdenum with reduced treatment waste comprising the steps of:

providing a molybdenum article to be etched with a resistive coating covering all but desired feature areas, which feature areas do not have a resistive coating and are exposed for etching;

etching said molybdenum article at said feature areas with an etchant selected from the group consisting of ferric sulfate and ferric ammonium sulfate;

rinsing the molybdenum article with water after etching;

collecting a rinse produced during said rinsing step;

precipitating iron from the rinse by raising the pH of the rinse above 2; and precipitating sulfate from the rinse by addition of lime.

5. A method of etching molybdenum with reduced treatment waste comprising the steps of:

etching a molybdenum article with ferric sulfate or ferric ammonium sulfate;

rinsing the molybdenum article with water after etching;

precipitating iron from the rinse by raising the pH of the rinse above 2:

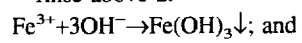; and precipitating sulfate from the rinse by a lime bed:

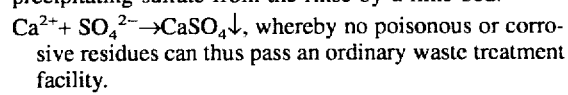, whereby no poisonous or corrosive residues can thus pass an ordinary waste treatment facility.

6. The method of claim 1 wherein said etching step includes the step of selecting ferric sulfate as said etchant.

7. The method of claim 1 wherein said etching step includes the step of selecting ferric ammonium sulfate as said etchant.

8. The method of claim 4 wherein said etching step includes the step of selecting ferric sulfate as said etchant.

9. The method of claim 4 wherein said etching step includes the step of selecting ferric ammonium sulfate as said etchant.

* * * * *